(12) United States Patent
Calvez

(10) Patent No.: US 7,991,603 B2
(45) Date of Patent: Aug. 2, 2011

(54) METHOD FOR SIMULATING A COMPLEX SYSTEM WITH EXPANSION OF INSTANCE VECTORS, CORRESPONDING COMPUTER PROGRAM PRODUCT AND STORAGE MEANS

(75) Inventor: Jean-Paul Calvez, La Chapelle sur Erdre (FR)

(73) Assignee: Cofluent Design, Nantes Cedex (FR)

( * ) Notice: Subject to any disclaimer, the term of this patent is extended or adjusted under 35 U.S.C. 154(b) by 890 days.

(21) Appl. No.: 11/870,920

(22) Filed: Oct. 11, 2007

(65) Prior Publication Data

US 2008/0091401 A1    Apr. 17, 2008

(30) Foreign Application Priority Data

Oct. 11, 2006    (FR) ...................................... 06 08913

(51) Int. Cl.
    *G06F 17/50*    (2006.01)
(52) U.S. Cl. ........................................... 703/13; 703/14
(58) Field of Classification Search ............... 703/13–14
    See application file for complete search history.

(56) References Cited

U.S. PATENT DOCUMENTS

| 6,816,825 | B1 * | 11/2004 | Ashar et al. ...................... 703/14 |
| 7,324,931 | B1 * | 1/2008 | Warlock .......................... 703/13 |
| 2003/0188299 | A1 * | 10/2003 | Broughton et al. ........... 717/141 |
| 2005/0257178 | A1 * | 11/2005 | Daems et al. ..................... 716/2 |

FOREIGN PATENT DOCUMENTS

| EP | 1 284 454 | 8/2002 |
| WO | WO 2006/084845 | 8/2006 |

OTHER PUBLICATIONS

Jean-Paul Calvez, "A System-Level Performance Model and Method," CIEM Current Issues in Electronic Modeling: Meta-Modeling: Performance, Software and Information Modeling, vol. 6, 1996, XP009082942, pp. 57-102.

* cited by examiner

*Primary Examiner* — Jason Proctor
*Assistant Examiner* — Aniss Chad
(74) *Attorney, Agent, or Firm* — David D. Brush; Westman, Champlin & Kelly, P.A.

(57) ABSTRACT

A method for simulating a complex system including a plurality of constituents is provided. The method includes constructing at least one complex system model, each system model including a hierarchised set of modelled constituents. The construction step includes, for each model, obtaining a multiple instance hierarchical model including at least one instance vector corresponding to a plurality of instances of one and the same modelled constituent, each instance vector being able to be located at any level of a hierarchical decomposition tree of the multiple instance hierarchical model. The construction step additionally includes, for each model, expanding the multiple instance hierarchical model into an expanded model by expansion of at least one instance vector included in the multiple instance hierarchical model.

9 Claims, 10 Drawing Sheets

METHOD FOR SIMULATING A COMPLEX SYSTEM WITH EXPANSION OF INSTANCE VECTORS, CORRESPONDING COMPUTER PROGRAM PRODUCT AND STORAGE MEANS

FIELD OF THE DISCLOSURE

The field of the disclosure is that of complex systems of the type that include a plurality of constituents, such as for example one or more processors executing a set of functions (possibly under the control of a hierarchised set of schedulers).

Processor is taken in the present document to mean any execution resource unit. The disclosure is not restricted only to software and hardware processors, used in electronic and computer systems, but also applies to mechanical processors (for example a robot executing one or more tasks) or humans (for example an operator executing one or more tasks).

Furthermore, in the present document, a scheduler is taken to mean a function capable of establishing a function or task execution order for a processor used as a resource. This function may be performed in software and/or hardware form, in respect of hardware and software processors, or by any other technique in respect of other types of processor (mechanical and human).

These complex systems make it possible in particular, but not exclusively, to run computer programs, also known as applications or software.

The disclosure relates to a technique for simulating a complex system of this kind. In other words, the inventive technique relates to the design and exploration of complex system architectures.

The inventive technique has been developed in order to study the architectures of complex electronic systems, both in relation to boards or "System-on-Chip" (SoC). Said systems systematically integrate hardware and software as execution resources for services.

However, given that the inventive technique is based on general constituent concepts (such as tasks (functions), processors (and therefore execution resources) and schedulers), it has a wider application than that of microprocessors. It covers any type of processor (see the definition above) that is required to share resources.

The inventive technique (description by multiple instances, also known as instance vectors) is intended to be most particularly suitable for the new telecommunications and multimedia technologies. Indeed, changes in customer requirements, data processing standards, voice and video and communications mean that scalable equipment has to be created including ever greater parallelism of functions and communications.

In electronic and computer systems, complex systems are implemented by assembling hardware components: central processing units (or CPU), microcontroller units (or MCU), digital signal processors (or DSP), application-specific integrated circuits (or ASIC), programmable logic networks, in particular field programmable gate arrays (or FPGA), thereby constituting the hardware platform of the system. Added to this platform is a software set (generally real-time operating systems, including in particular a scheduler) developed for each software processor (CPU, MCU, DSP), and the hardware processor configuration (ASIC, FPGA). All these constituents (hardware and software) once integrated (trend towards "System-On-Chip" systems on silicon) constitute a complex system whereof the detailed behaviour and some properties, such as their performance, are almost impossible to predict.

The design of complex systems is an activity upstream of implementation, integration and testing, which requires engineers to predict the properties of the system to be developed very early on, so that all constituent characteristics can be decided.

With the growth in complexity and the reduction in development time, designers need to have computer-aided design (CAD) tools available. The inventive technology meets this need.

Prediction of the properties of such systems in terms of performance in the general sense results from simulating abstract models representing as closely as possible complex electronic systems that are able to combine hardware processors (FPGA, ASIC) and software processors (CPU, MCU, DSP). The very nature of present-day electronic systems and those of the future, which are the result of integrating real-time software running on one or more processors themselves coupled to a complex and highly varied hardware environment, means that fast and effective simulation techniques are needed in order to verify and validate solutions as effectively and as early as possible during their design. For this reason, said simulation technologies are extremely critical for the electronic design automation industry (or EDA).

Conventionally, complex systems are studied firstly through functional and then architectural modelling. These models are used to provide verifications and analyses of both functional and performance properties. The properties are obtained by model simulation. For further information, please refer to Electronic Systems Design Methodologies (or MCSE in French) and to the CoFluent Studio (registered trademark) tools developed by the CoFluent Design company (the applicant in respect of the present patent application), which implement part of said MCSE methodology.

To be more precise, the disclosure relates to a technique for simulating a complex system, with the creation of one or more models based on constituent vectors (an instance vector corresponds to a plurality of instances of one and the same modelled constituent) facilitating the modelling and verification of said systems and the exploration of possible architectures.

BACKGROUND

The use of constituent vectors when creating a complex system model today meets a burgeoning need since more and more systems are being constructed by assembling a number of exemplars (or instances) of constituents (also known as components). The problem then arises as to how to describe such architecture models and convert them in order to study their properties.

To illustrate the problem, let us consider products of the communications network type. To be more precise, by way of example FIGS. 1 and 2 illustrate the case of an Ethernet switch.

FIG. 1 shows the functionality required 10. The frames received at each of the input ports must be retransmitted as quickly as possible to one of the destination ports or to the other three ports ("broadcast") as a function of the destination address found in the incoming frame. Clearly, the desired performance levels require the maximum number of simultaneous transmissions and with no loss of frames.

The top part of FIG. 2 shows a possible functional architecture solution 21 representing the necessary internal functions and couplings between these functions. It is clear that the architecture has to be based on receiver ("Receiver[1:N]") 23 and transmitter ("Transmitter[1:N]") 24 vectors in line with the number of switch ports and that frame routing requires a set of relations by message queues of the FIFO ("First-In First-Out") type.

The bottom part of FIG. 2 is a possible proposal for representing the internal hardware architecture 22. A vector of p processors ("Proc[1:p]") 25 is used and the processors communicate via a common memory 26. Each processor has two parts (ProcRx 27 and ProcTx 28) and which are also coupled via a bus 210 and a local memory 29.

FIG. 2 shows the advantage of the component and relationship vector concept in describing complex new architectures.

But the use of this vector concept, which simplifies representation, compounds the difficulty of two aspects:
- verifying the detailed behaviour of the functional model because each element of each vector is not identified separately; and
- constructing the architectural model resulting from mapping (denoted 211 in FIG. 2) the functional architecture on the hardware architecture. Indeed, it becomes almost impossible to be able to map each function or functional relationship vector element (constituent vectors of the functional architecture) on a processor, bus or memory vector element (constituent vectors of the hardware architecture).

A new degree of complexity also arises with configurable products of the FPGA type and which justifies the use of the instance vector concept. Indeed, the very architecture of these components enables the instantiation of any number of processors, memories, FIFOs and buses, and does so according to very different topologies.

Two techniques are known, in the prior art, for describing the functional or physical models (also known as platforms) of complex systems.

In the first known technique, almost exclusively used today, describing complex system models involves individually designing each modelled constituent, and all interconnections between the modelled constituents. The model of each constituent may come from a model held in a phase library so as to facilitate duplication.

The major drawback of the first known description technique is the significant time needed for keyboarding and the non-generic character (in other words the non adaptation to a modifiable number of constituents).

In the second known technique, used today only in a few special circumstances, the description of complex system models is based on a mechanism that allows the multiplicity of the constituents to be indicated (instance vector notion in the aforementioned sense). The interconnections then comply with rather regular patterns.

This technique for the representation of a model (application model or platform model) by using multiple instances of constituents (functions and relations, or processors, memories and communication nodes) has been used in the aforementioned CoFluent Studio (registered trademark) tools since June 2005.

It is set out in detail in the following work published by the inventor of the present application: "A System-Level Performance Model and Method. Jean-Paul Calvez, Chapter 2 in Meta-Modeling: Performance and Information Modeling. pp 57-102-1996 CIEM Vol 6 (Current Issues in Electronic Modeling). Edited by Jean-Michel Bergé, Oz Levia, Jacques Rouillard. Kluwer Academic Publishers ISBN 0-7923-9687-1".

It will be noted that a function, a relation, a processor, a memory or a communication node, is represented for example in the graphical form of a rectangle or a circle with its shadow in order to indicate multiplicity. However this form of representation is not restrictive. Any form can be used to represent said concept (text for example in the form of a vector [1:N]).

The second known technique considerably simplifies the work of keyboarding the models and gives a better structure to their regularity and their genericity. Multiplicity (instance vector notion) may be described for any level in the hierarchical model representation. The instance vectors (also known as multiple instances) may be nested.

However the second known technique has the drawback of much restricting the architecture possibilities. Indeed, each instance vector is considered as a non-decomposable constituent and can therefore only allot itself overall to a single processor type resource. A processor instance vector cannot be used directly since it is not a simple matter to define function mapping on each vector processor. Moreover, all the elements of a vector have the same properties.

Another drawback of the second known technique is that it does not facilitate verification of the model obtained either. Indeed, simulating this model provides a time flow which is quite complex to understand and subject to wrong interpretation given the stacking of instance vector states (multiple constituents) (see the example in FIG. 6).

The above drawbacks lead to the situation in which the designers do not create or create only a few models of such architectures. Such architectures are therefore not studied and potential solutions not explored or only with great difficulty, which leads to difficulties in taking decisions in respect of such products.

The present disclosure provides a technique for simulating a complex system with construction of at least one model of said system, said technique enabling the instance vector concept (in the aforementioned sense) to be used without however restricting the architecture possibilities (better exploration of solution architectures) and facilitating verification of the model or models constructed (in other words detailed analysis of model behaviour).

The disclosure provides a technique of this kind which is straightforward to implement and inexpensive.

SUMMARY

In a particular example, a method is proposed for the construction, within a computer system, of at least one model of a complex electronic system including a plurality of constituents, each system model including a hierarchised set of modelled constituents, said construction method including, for each model, a step of obtaining a multiple instance hierarchical model including at least one instance vector corresponding to a plurality of instances of one and the same modelled constituent, each instance vector being able to be located at any level of a hierarchical decomposition tree of said multiple instance hierarchical model, said construction method additionally includes, for each model, a step of expanding said multiple instance hierarchical model into an expanded model, by expansion of at least one instance vector included in said multiple instance hierarchical model.

An exemplary inventive principle is therefore the use of an operation to convert a multiple instance hierarchical model into an expanded model. The instance vector concept thus continues to be used to obtain the multiple instance hierarchical model. But we go further in obtaining therefrom an expanded hierarchical model, which involves no limitation in the architecture possibilities (better exploration of solutions architectures) and is easily verifiable (analysing its behaviour is straightforward).

To advantage, the step of expanding said at least one multiple instance hierarchical model itself includes the following steps, carried out for each instance vector to be expanded corresponding to N instances of a modelled constituent:

expanding said instance vector into a number of modelled constituents equal to said number N of instances; and producing the input or inputs and/or the output or outputs of each of the N modelled constituents, according to a set of at least one production rule.

To advantage, the step of expanding said at least one multiple instance hierarchical model includes the following steps:

running down said hierarchical decomposition tree, recursively from a root to leaves, so that for each level of said hierarchical decomposition tree, each instance vector to be expanded is expanded into a preset number of modelled constituents;

going back up said hierarchical decomposition tree, recursively from the leaves to the root, so that for the each level of said hierarchical decomposition tree, the input or inputs and/or the output or outputs of the modelled constituents resulting from the expansion of the instance vector are produced according to said set of at least one production rule.

In a first example, said expansion step is systematic and comprises an expansion of all the instance vectors.

In a second example, said expansion step is selective and comprises an expansion only of the instance vectors associated with an expansion attribute taking a value indicating that an expansion is to be carried out.

To advantage, the method includes a step of constructing a functional complex system model, itself including a step of obtaining a multi-instance hierarchical functional model and a step of expanding said multi-instance hierarchical functional model into an expanded functional model.

To advantage, said multiple instance hierarchical functional model includes at least one instance vector belonging to the group including:

function vectors each corresponding to a plurality of instances of a modelled function; and relationship vectors each corresponding to a plurality of instances of a modelled relationship.

To advantage, said set of at least one production rule includes the following rules applied to the elementary function vectors each corresponding to a plurality of instances of a modelled elementary function:

if, in the multiple instance hierarchical model, an elementary function vector output is connected to a relationship vector:

if said elementary function vector output is associated with an output selector included in a behavioural model of said modelled elementary function:

if the output selector is defined by a parameter indicating assignment in a "1 to 1" relationship, then each instance obtained after expansion of the elementary function vector has an output connected, in said "1 to 1" relationship, to a same index instance among instances obtained after expansion of said relationship vector;

if the output selector is defined by a parameter indicating assignment in a "1 to X" relationship, with X>1, then each instance obtained after expansion of the elementary function vector has X outputs, each connected to a same index instance among the instances obtained after expansion of said relationship vector;

if said elementary function vector output is not associated with an output selector included in a behavioural model of said modelled elementary function, then each instance obtained after expansion of the elementary function vector has an output connected, in a "1 to 1" relationship, to a same index instance among the instances obtained after expansion of said relationship vector.

Preferably, said set of at least one production rule includes the following rules applied to the elementary function vectors each corresponding to a plurality of instances of a modelled elementary function:

if, in the multiple instance hierarchical model, an elementary function vector input is connected to a relationship vector:

if said elementary function vector input is associated with an input selector included in a behavioural model of said modelled elementary function:

if the input selector is defined by a parameter indicating assignment in a "1 to 1" relationship, then each instance obtained after expansion of the elementary function vector has an input connected, in said "1 to 1" relationship, to a same index instance among the instances obtained after expansion of said relationship vector;

if the input selector is defined by a parameter indicating assignment in a "1 to X" relationship, with X>1, then each instance obtained after expansion of the elementary function vector has X inputs, each connected to a same index instance among the instances obtained after expansion of said relationship vector;

if said elementary function vector input is not associated with an input selector included in a behavioural model of said modelled elementary function, then each instance obtained after expansion of the elementary function vector has X inputs, each connected to a same index instance among the instances obtained after expansion of said relationship vector.

To advantage, the step of expanding said multiple instance hierarchical functional model includes the following step, carried out for at least one instance vector which is an elementary function vector corresponding to a plurality of instances of a modelled elementary function, namely that of optimising the behavioural model of said modelled elementary function, by eliminating from said behavioural model:

any output selector associated with said modelled elementary function and indicating assignment in a "1 to 1" relationship; and/or any input selector associated with said modelled elementary function and indicating assignment in a "1 to 1" relationship.

Preferably, said set of at least one production rule includes the following rule applied to the non-elementary function vectors each corresponding to a plurality of instances of a modelled non-elementary function:

if, in the multiple instance hierarchical model, an input, and output respectively, of a non-elementary function vector is connected to a relationship vector:

if there is a "1 to 1" relationship for all the inputs, and outputs respectively, connected to said relationship vector and belonging to functions which are internal to said modelled non-elementary function, each instance obtained after expansion of the non-elementary function vector has an input, and output respectively, connected in a "1 to 1" relationship, to a same index instance among the instances obtained after expansion of said relationship vector;

if not, each instance obtained after expansion of the non-elementary function vector has X inputs, and outputs respectively, each connected to a same index input, and output respectively, for all the instances obtained after expansion of said relationship vector.

To advantage, said set of at least one production rule includes the following rules:

if, in the multiple instance hierarchical model, an elementary or non-elementary function vector output is connected to a modelled non-vectored relationship, then each instance obtained after expansion of the function vector has an output connected to said modelled relationship;

if, in the multiple instance hierarchical model, an elementary or non-elementary function vector input is connected to a non-vectored modelled relationship, then each instance obtained after expansion of the function vector has an input connected to said modelled relationship.

To advantage the method includes a step of constructing a hierarchical platform model of the complex system, itself including a step of obtaining a multiple instance hierarchical platform model and a step of expanding said multiple instance hierarchical platform model into an expanded platform model.

Preferably, said multiple instance hierarchical platform model includes at least one instance vector belonging to the group including:

processor vectors each corresponding to a plurality of instances of a modelled processor;

memory vectors each corresponding to a plurality of instances of a modelled memory; and communication node vectors each corresponding to a plurality of instances of a modelled communication node.

To advantage, with each communication node vector is associated an expansion configuration parameter, and in that said set of at least one production rule includes the following rules, for each communication node vector connected to a processor or memory vector:

if the expansion configuration parameter indicates "links to all", then each communication node vector instance is connected to each of the processor or memory vector instances;

if the expansion configuration parameter indicates "linear", then the instances of the processor or memory vector are connected to each other in a linear way, via instances of the communication node vector;

if the expansion configuration parameter indicates "ring", then the instances of the processor or memory vector are connected to each other in a ring, via instances of the communication node vector.

Preferably, the method includes a step for the distributed allocation of said expanded functional model on said expanded platform model, allowing an expanded architectural model of said complex system to be obtained.

In another example, the disclosure relates to a computer program product that can be recorded on a readable medium by computer, said computer program product including program code instructions for the execution of steps in the aforementioned method, when said programme is run on a computer.

In another example, the disclosure relates to a storage medium, possibly totally or partially removable, computer readable, storing a set of instructions that can be executed by said computer in order to implement the aforementioned method.

Other characteristics and advantages will emerge from reading the following description of one example, given by way of information and non-restrictively (all examples are not restricted to the characteristics and advantages of this example), and the appended drawings.

DETAILED DESCRIPTION OF ILLUSTRATIVE EMBODIMENTS

In all the figures in the present documents, identical elements and steps are designated using one and the same numerical reference system.

General Principle

Figure 2:
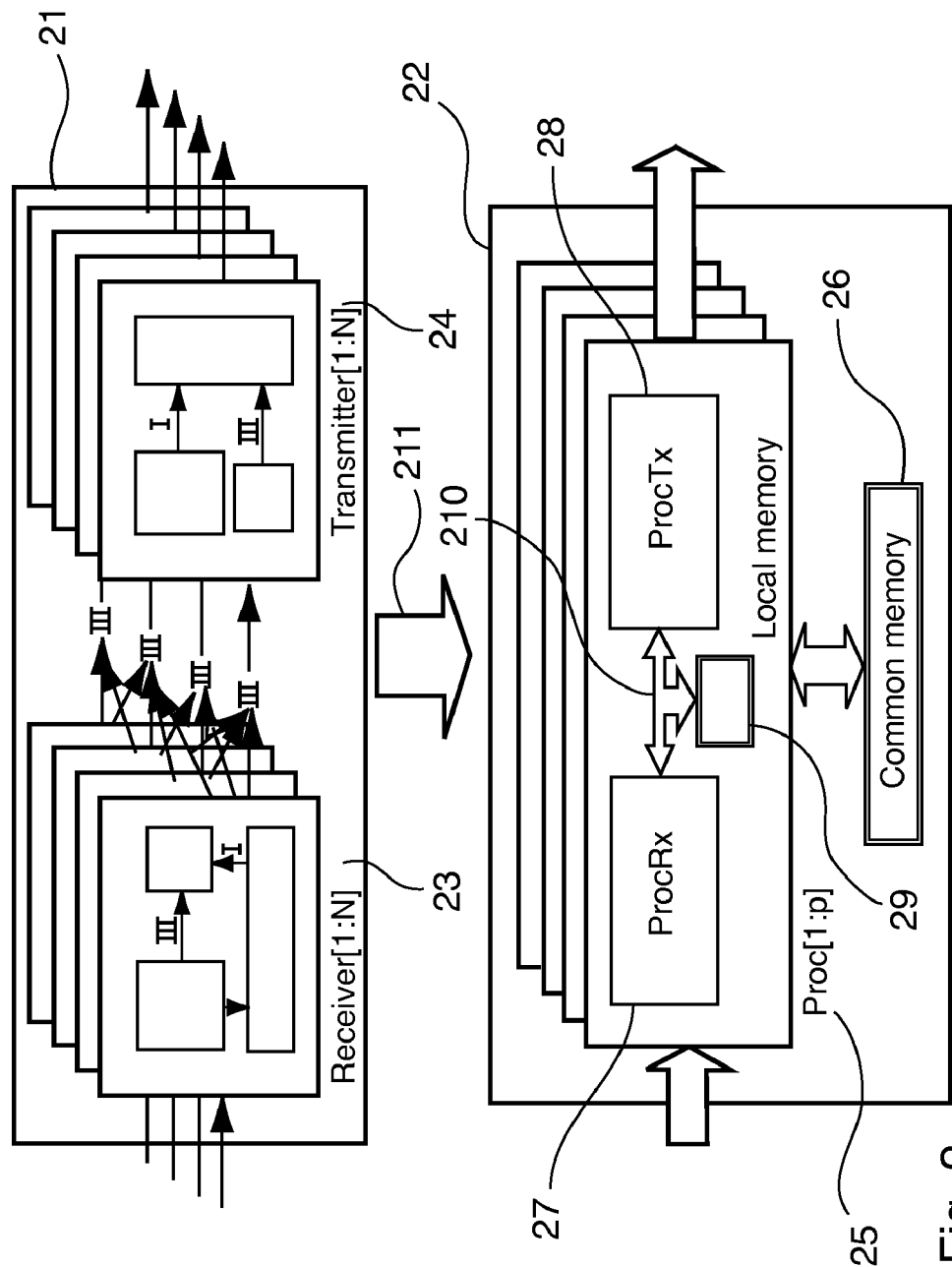
FIG. 2 shows an example of a multiple instance functional model and a multiple instance platform model for the Ethernet switch in FIG. 1.
Figure 1:
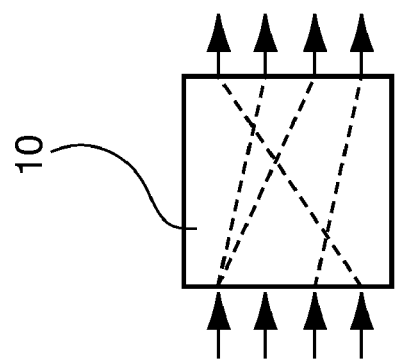
FIG. 1 shows, as an example of a complex system, an Ethernet switch.
Figure 3:
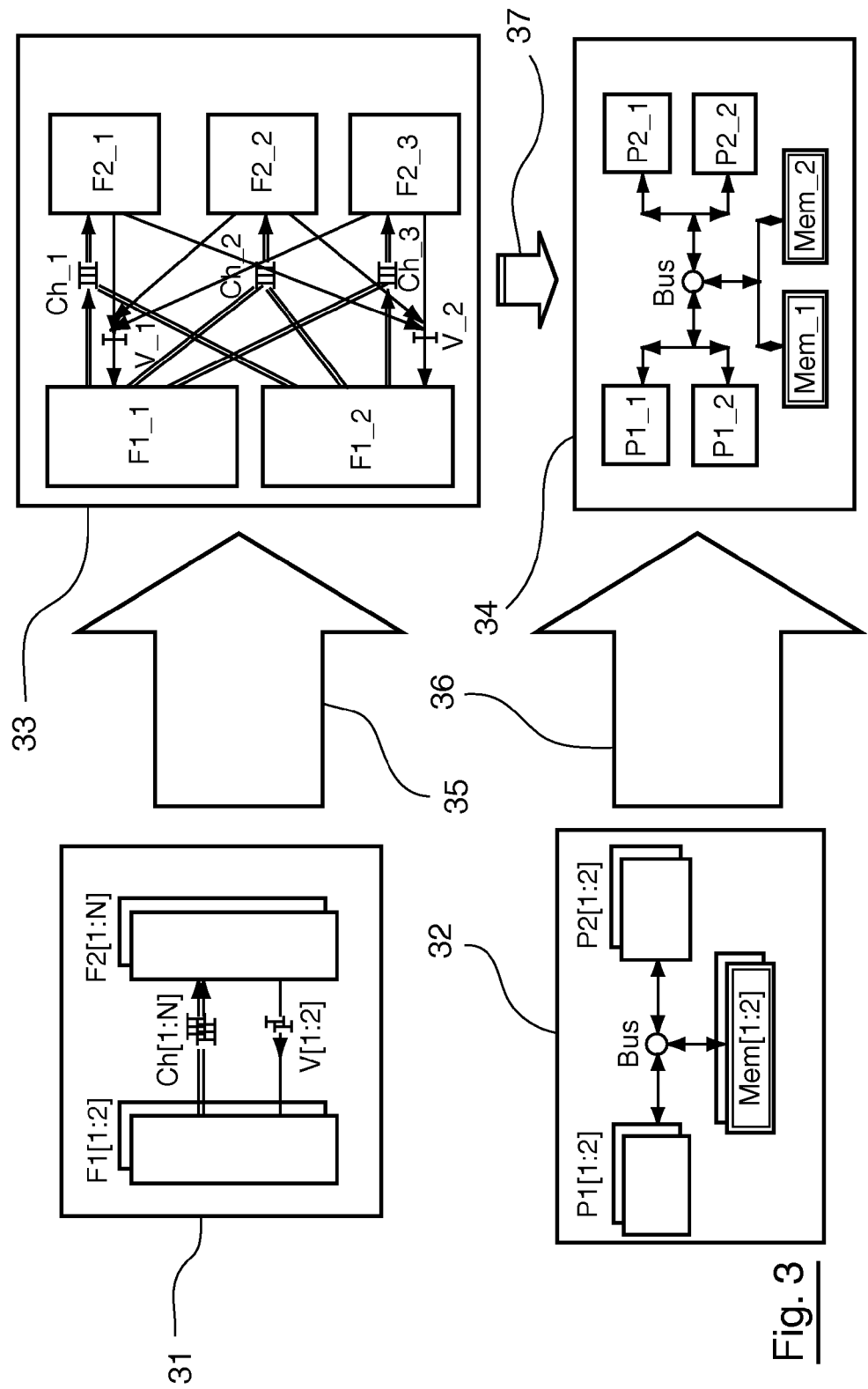
FIG. 3 shows the general principle of an aspect of the disclosure, through an example of expansion of a multiple instance functional model and a multiple instance platform model.

FIG. 3 shows an example of the expansion of a multiple instance functional model 31 and a multiple instance platform model 32. These models 31, 32, shown on the left-hand part of FIG. 3, are the result of modelling carried out by the designer, with the help for example of CoFluent Studio (registered trademark) technology, using the instance vector concept. On the right-hand part of FIG. 3 are shown the expanded models 33, 34 resulting from an expansion (symbolised by the arrows denoted 35 and 36 respectively) of each of the aforementioned models 31, 32. The expansion may be systematic (expansion of all the instance vectors) or selective (expansion only of the instance vectors associated with an expansion attribute taking a value indicating that an expansion is to be carried out).

The resulting advantage appears on the right-hand side since after expansion, the expanded functional model is easily verifiable and any modelled and individualised functional constituent can be mapped on any execution constituent of the modelled and individualised platform, for the study of architectures. The mapping (also known as the "distributed allocation") of the expanded functional model on the expanded platform model is symbolised by the arrow denoted 37.

An exemplary, general principle is therefore the use of an operation to convert a multiple instance model into an expanded model. The conversion is global (all constituents are expanded) or selective (for each multiple instance constituent, an attribute indicates whether or not there is to be expansion). The result of the conversion is intended to be optimised in the direction in which the necessary input/outputs for each component are produced (1 to 1 or 1 to N relationship) and the behavioural model of each elementary function (not shown in the figure) is also optimised according to the necessary input/outputs.

The principle of conversion to expand the functional model is as follows, in a particular example:

1. Conversion starts at the global level (root) of the functional model, considered as the first common component without input/outputs.
2. For each relationship vector included in the common component, the modelled relationship is duplicated into a plurality of instances and each of the instances of the modelled relationship is named by adding an index to its name.
3. For each function vector included in the common component, the modelled function is duplicated into a plurality of instances and each of the instances of the modelled function is named by adding an index to its name.
4. The procedure is pursued recursively for each internal modelled function after duplication, considering it as a new common component (return to 2). The upper level index is propagated and concatenated with the common index.
5. Recursivity ends when the common component is terminal or a leaf on the decomposition tree. In other words, steps 1 to 5 run down a hierarchical decomposition tree of the functional hierarchical model, recursively from a root to leaves, such that for each tree level, each instance vector to be expanded is expanded into a preset number of modelled constituents.
6. Then, for each leaf of the decomposition tree, an attempt is made to optimise the behavioural model of each elementary function whereof several instances are included in this leaf, in the form of an elementary function vector. The term elementary function is given to a function which does not itself include another function. Optimisation involves the selector or selectors which are included in the behavioural model and make it possible, at the input and/or output of the elementary function involved, to choose a transmitting constituent instance at input and/or a destination constituent instance at output, for each elementary function vector instance. These selectors are necessary in order to specialise the input/outputs and the behaviour of each elementary function vector instance, but have no further grounds for existing once the expansion of this vector is complete. Optimisation therefore consists in representing the effect of the selectors in the behaviour of each vector instance. Optimisation may thus cause a simplification or increasing complexity of the behaviour of the component instance under consideration (for example adding alternatives into the control stream) as a function of the presence or absence of input and output selectors and of the value of the selection condition.
7. Next, for each leaf of the decomposition tree, the inputs and outputs of each modelled elementary function, resulting from the expansion of an elementary function vector, are produced as a function of the optimisations and of the links with the modelled relationships or the relationship vectors to which these inputs and outputs are connected. A complete set of rules for producing the inputs and outputs is provided below. To sum up, each vector input or output is either expanded, and therefore replaced by as many inputs or outputs as instances in the vector, or replaced by a single input or output corresponding to the rating of the instance under consideration.
8. This adaptation of the input/outputs of components is pursued when going back up the hierarchical decomposition tree, recursively from the leaves to the root (global level) such that for each tree level, the input or inputs and/or the output or outputs of the modelled constituents resulting from the expansion of an instance vector are produced according to the set of production rules. For modelled composite functions or composite function vectors, the determination of the inputs and outputs is deduced from the inputs and outputs of the internal modelled functions (in particular, a relationship of the "1 to 1" type at output, and respectively input, of a modelled composite function is only possible if all the outputs, and inputs respectively, of the internal functions are also of the "1 to 1" type). The term composite function (or non-elementary function) is given to a function which itself includes another function.

In a particular example, the principle of conversion to expand the platform model is fairly similar but more straightforward since the terminal components (in the leaves of the decomposition tree) do not have a behavioural model.

1. Conversion starts at the global level (root) of the platform model, considered as the first common component without input/outputs.
2. For each instance vector included in the common component, the modelled constituent (processor, memory or communication node) is duplicated into a plurality of instances and each of the instances is named by adding an index to its name.
3. The procedure is pursued recursively for each internal modelled constituent after duplication, by considering it as a new common component (return to 2). The upper level index is propagated and concatenated with the common index.
4. Recursivity ends when the common component is terminal or a leaf of the decomposition tree. In other words, steps 1 to 4 run down a hierarchical decomposition tree of the platform hierarchical model, recursively from a root to leaves, such that for each tree level, each instance vector to be expanded is expanded into a preset number of modelled constituents.
5. Next, said each leaf of the decomposition tree, the inputs and outputs of each modelled constituent, resulting from the expansion of an instance vector, are produced as a function of a set of production rules (see set example below).
6. This adaptation of the input/outputs of the components is pursued when going back up a hierarchical decomposition tree, recursively from the leaves to the root (global level), such that for each tree level, the import or inputs and/or the output or outputs of the modelled constituents resulting from the expansion of an instance vector are produced according to the set of production rules.

Example of a Set of Rules for Producing Input/Outputs

Producing Input/Outputs for an Extended Functional Model

It is assumed in what follows that the multiple instance hierarchical functional model, which is to be expended, in order to obtain the expanded hierarchical functional model, includes at least one instance vector belonging to the group including:

function vectors each corresponding to a plurality of instances of a modelled function; and relationship vectors each corresponding to a plurality of instances of a modelled relation.

The set of production rules includes the following rules applied to the elementary function vectors each corresponding to a plurality of instances of a modelled elementary function:

if, in the multiple instance hierarchical model, an elementary function vector output is connected to a relationship vector:

if said elementary function vector output is associated with a output selector included in a behavioural model of said modelled elementary function:

if the output selector is defined by a parameter indicating assignment in a "1 to 1" relationship, then each instance obtained after expansion of the elementary function vector has an output connected, in a "1 to 1" relationship, to a same index instance among instances obtained after expansion of said relationship vector;

if the output selector is defined by a parameter indicating assignment in a "1 to X" relationship, with X>1, then each instance obtained after expansion of the elementary function vector has X outputs, each connected to a same index instance among the instances obtained after expansion of said relationship vector;

if said elementary function vector output is not associated with an output selector included in a behavioural model of the modelled elementary function, then each instance obtained after expansion of the elementary function vector has an output connected, in a "1 to 1" relationship, to a same index instance among the instances obtained after expansion of said relationship vector.

if, in the multiple instance hierarchical model, an elementary function vector input (decomposition tree leaves) is connected to a relationship vector:

if the elementary function vector input is associated with an input selector included in the behavioural model of the modelled elementary function:

if the input selector is defined by a parameter indicating assignment in a "1 to 1" relationship, then each instance obtained after expansion of the elementary function vector of has an input connected, in the "1 to 1" relationship, to a same index instance among the instances obtained after expansion of said relationship vector;

if the input selector is defined by a parameter indicating assignment in a "1 to X" relation, with X>1, then each instance obtained after expansion of the elementary function vector has X inputs, each connected to a same index instance among the instances obtained after expansion of said relationship vector;

if the elementary function vector input is not associated with an input selector included in a behavioural model of the modelled elementary function, then each instance obtained after expansion of the elementary function vector has X inputs, each connected to a same index instance among the instances obtained after expansion of the relationship vector.

Optimisation of the behavioural model of the modelled elementary function involves eliminating from it:

any output selector associated with the modelled elementary function and indicating assignment in a "1 to 1" relationship; and/or any input selector associated with the modelled elementary function and indicating assignment in a "1 to X" relationship.

The set of production rules additionally includes the following rule applied, during the step of going back up the decomposition tree, to the vectors of non-elementary functions (also known as composite functions) each corresponding to a plurality of instances of a modelled non-elementary function:

if, in the multiple instance hierarchical model, an input, and output respectively, of a non-elementary function vector is connected to a relationship vector:

if there is a "1 to 1" relationship for all the inputs, and outputs respectively, connected to said relationship vector and belonging to functions which are internal to said modelled non-elementary function, each instance obtained after expansion of the non-elementary function vector has an input, and output respectively, connected in a "1 to 1" relationship to a same index instance among the instances obtained after expansion of said relationship vector;

if not, each instance obtained after expansion of the non-elementary function vector has X inputs, and outputs respectively, each connected to a same index input, and output respectively, for all the instances obtained after expansion of said relationship vector.

The set of production rules additionally includes the following rules:

if, in the multiple instance hierarchical model, an elementary or non-elementary function vector output is connected to a non-vectored modelled relationship, then each instance obtained after expansion of the function vector has an output connected to the modelled relationship;

if, in the multiple instance hierarchical model, an elementary or non-elementary function vector input is connected to a non-vectored modelled relationship, then each instance obtained after expansion of the function vector has an input connected to the modelled relationship.

Producing Input/Outputs for an Expanded Platform Model

It is assumed in what follows that the multiple instance hierarchical platform model which is to be expanded, in order to obtain the expanded hierarchical platform model, includes at least one instance vector belonging to the group including:

processor vectors each corresponding to a plurality of instances of a modelled processor;

memory vectors each corresponding to a plurality of instances of a modelled memory; and communication node vectors each corresponding to a plurality of instances of a modelled communication node.

Each communication node vector is associated with an expansion configuration parameter.

The set of production rules includes the following rules, for each communication node vector connected to a processor or memory vector:

if the expansion configuration parameter indicates "links to all", then each communication node vector instance is connected to each of the processor or memory vector instances;

if the expansion configuration parameter indicates "linear", then the instances of the processor or memory vector are connected to each other in a linear way, via instances of the communication node vector. The modelled node i is connected to the modelled processor or to the modelled memory i on one side and to the modelled processor or to the modelled memory i+1 on the other, if i<N with N the number of instances of the expanded processor or memory vector; and if the expansion configuration parameter indicates "ring", then the instances of the processor or memory vector are connected to each other in a ring, via instances of the communication node vector. The node modelled i is connected to the modelled processor or to the modelled memory i on one side and to the modelled processor or to the modelled memory i+1 on the other, if i<N with N the number of instances of the expanded processor or memory vector. The modelled node i is connected to the modelled processor or to the modelled memory i on one side and to the modelled processor or to the modelled memory 1 on the other, if i=N.

It is clear that expansion configuration patterns other than those mentioned above ("links to all", "linear" and "ring") are conceivable without departing from the framework of the present disclosure.

Figure 4:
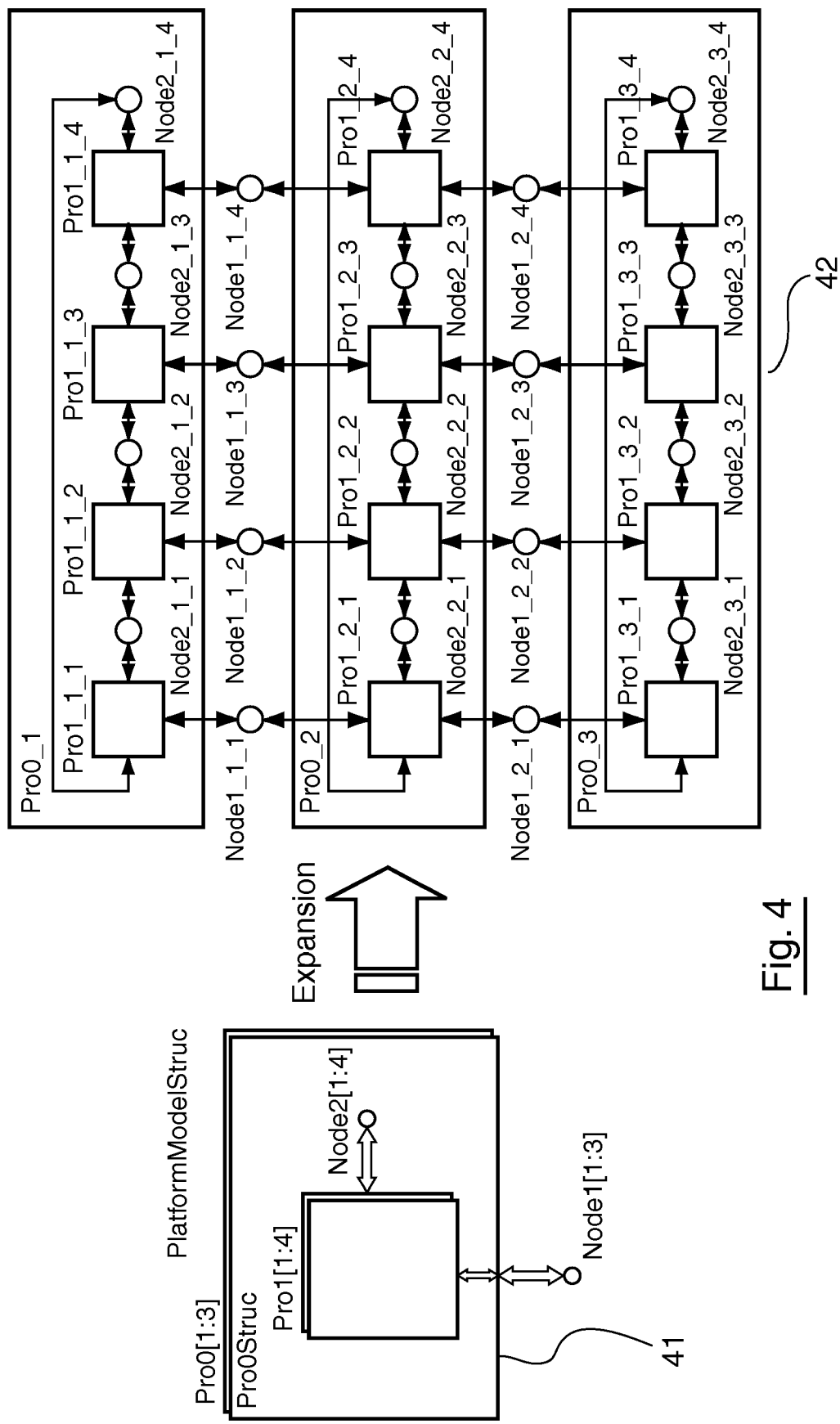
FIG. 4 shows an expansion example of a platform model, according to a horizontal ring pattern and a vertical linear pattern.

FIG. 4 shows an expansion example of a platform model 41, in a ring pattern for "Node2" and a linear pattern for "Node1". The resulting expanded model is denoted 42.

Detailed Illustrated Description

In the remainder of the description, an example is given of the method in operation (underlying model expansion technology), in a new version of CoFluent Studio (registered trademark) tools, in order to obtain an expanded functional model and then an expanded architectural model. The different models are shown in accordance with the notations and semantics described in MCSE.

Creating the Application Model

The CoFluent Studio graphics editor is used to capture the functional models (also known as application models) constituted by communicant and concurrent "functions" which have their own behaviour and input/outputs.

Figure 5:
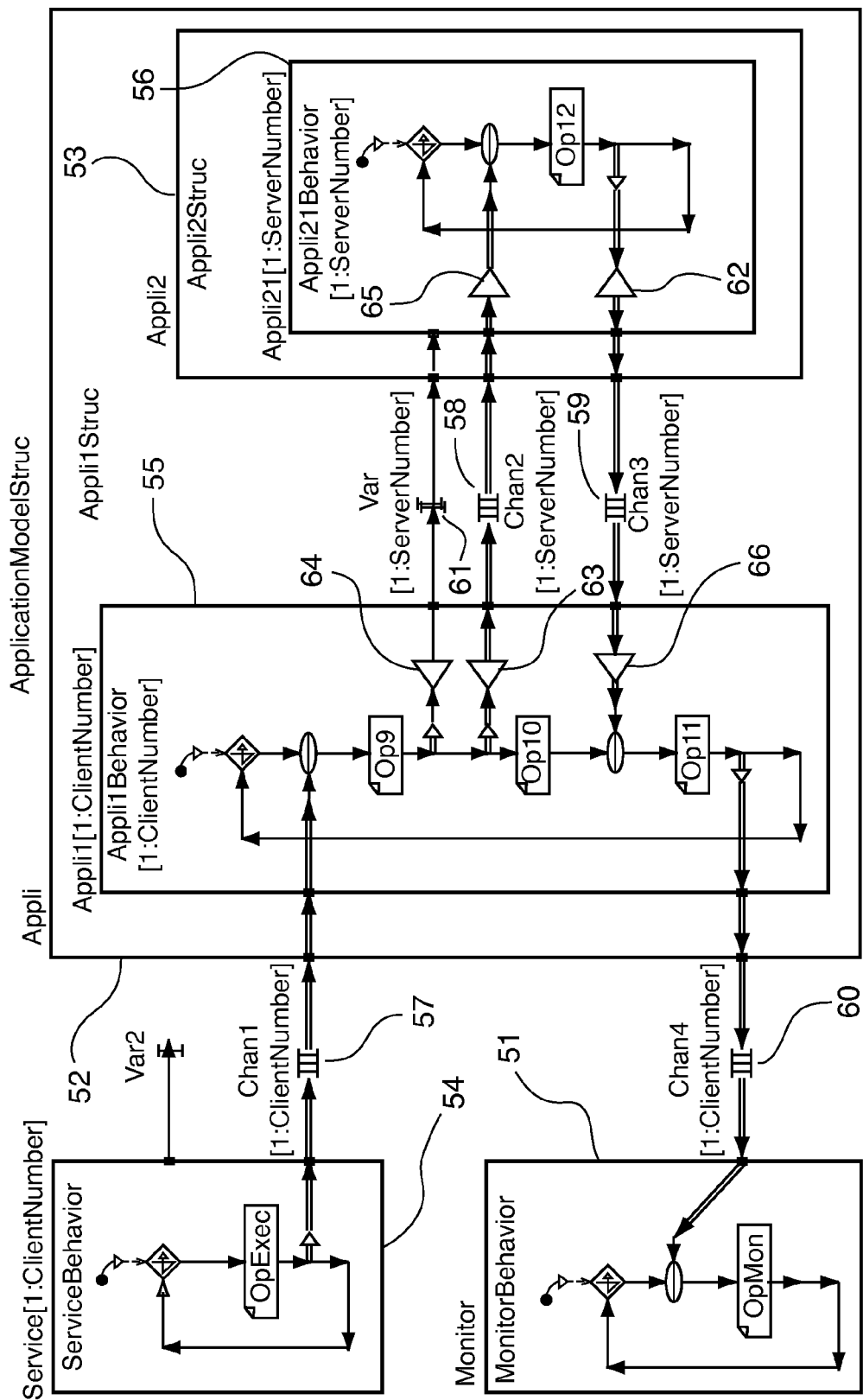
FIG. 5 shows an example of a multiple instance functional model, unexpanded.

FIG. 5 shows the illustrative example considered for the multiple instance functional model (unexpanded).

It comprises modelled functions, straightforward ("Monitor", denoted 51) and hierarchical ("Appli" and "Appli2", denoted 52 and 53 respectively), function vectors ("Service", "Appli1" and "Appli21", denoted 54, 55 and 56 respectively) and functional relationship vectors ("Chan1", "Chan2", "Chan3", "Chan4" and "Var", denoted 57 to 61 respectively). For each modelled elementary function 51 or elementary function vector 54, 55, 56, a graph of its behavioural model is shown in the block representing this modelled elementary function or this elementary function vector. These behavioural models include output selectors denoted 62 to 64, and input selectors denoted 65 and 66.

It shows a client-server system and the couplings thereof. The behavioural models of the modelled functions allow the operation to be understood quite easily. The selectors used in relation to the inputs and outputs allow designation of the source input or destination output respectively.

Each "Service" instance sends a request in the corresponding Chan1 message queue (1 to 1 relationship since no selector at "Service" output).

Each "Appli1" instance is on standby for all "Chan1" instances (since no selector at input). Each "Appli1" instance communicates with an "Appli21" instance (server side) by designating the correspondent by the output 63, 64 and input 66 selectors. Finally, each "Appli1" instance supplies a message after "Op11", via the corresponding "Chan4" instance (no selector), to the "Monitor" function which is on standby for all the "Chan4" instances.

Each "Appli21" instance (server side) is on standby for the corresponding "Chan2" instance, uses the corresponding "Var" instance and provides its result to the "Appli1" instance (client side) which has caused the activation. This is obtained if the client indicates his instance number in his request.

Figure 6:
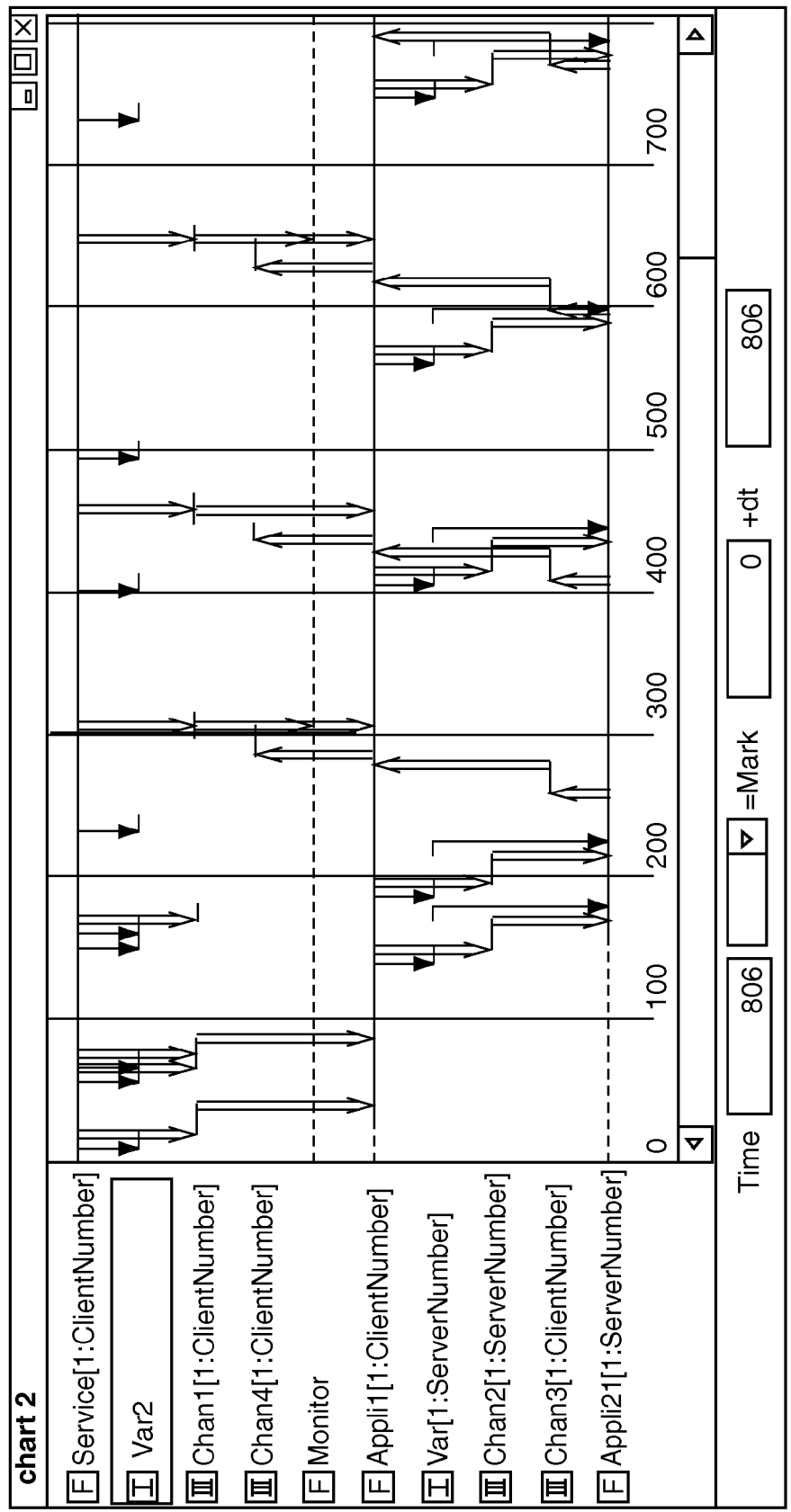
FIG. 6 shows an example of the time flow obtained by simulating the unexpanded model in FIG. 5.

Direct simulation of this unexpanded model, with the CoFluent Studio tool, provides the time flow shown in FIG. 6 (for a description and detailed understanding of this representation, please refer to the CoFluent Studio documentation). Understanding this time flow remains quite a complex matter and subject to wrong interpretation given the stacking of function and multiple relationship states.

Selective Expansion of the Application Model

Figure 7:
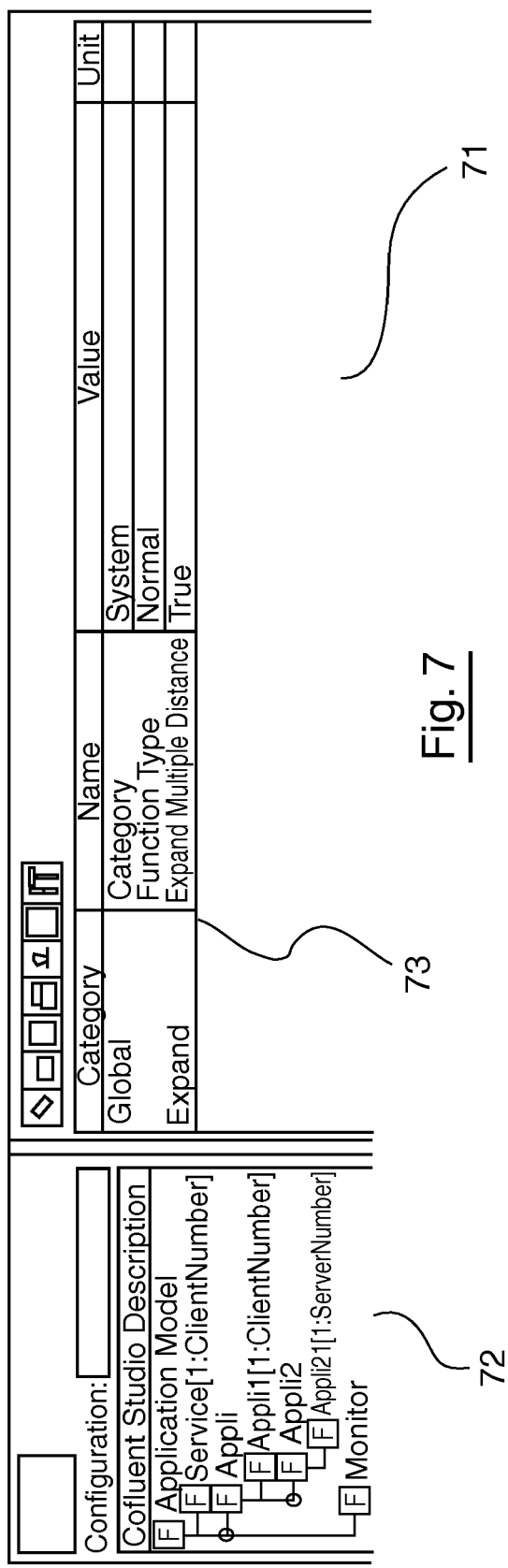
FIG. 7 shows an example of a software tool for editing the attributes of the modelled constituents (components) of a model, and in particular an expansion attribute.

FIG. 7 shows an example of a software tool for editing the attributes of the modelled constituents of a model. It enables in particular an expansion attribute to be defined for each instance vector. The selective expansion required is thus parameterised by the attribute editor: for each function or relationship vector, an expansion attribute appears, which may be assigned true or false.

To be more precise, in this example, the left-hand window 72 displays the hierarchy of the functional model (the names of the elements are identical to those in FIG. 5) and the element of this commonly selected hierarchy (it appears in a greyed out frame: "Service[1:ClientNumber]" in this example) and whereof the attributes may therefore be defined. The right-hand window 71 displays the attributes of the element selected in the left-hand window 72. In the example shown, this is the elementary function vector termed "Service[1:ClientNumber]" and denoted 54 in FIG. 5. The right-hand window 71 includes four columns, which indicate respectively, for each attribute: the attribute category to which this attribute belongs, the name of this attribute, the value of this attribute and the unit in which this value is expressed. Among the different "Service[1:ClientNumber]" attributes will be noted in particular, in the "Expand" category, the "Expand Multiple-Instance" expansion attribute 73, the "true" value of which indicates that it is to be expanded.

Expansion is then carried out by the CoFluent Studio SystemC model generator.

This operates in accordance with two phases:

Phase 1: Analysis of the functions and relationships to be expanded and construction of the corresponding optimised textual functional model.

Phase 2: Conversion of the resulting textual model into a SystemC source program using the attribute parameterisation of all constituents and algorithms related to the behavioural model.

Figure 8:
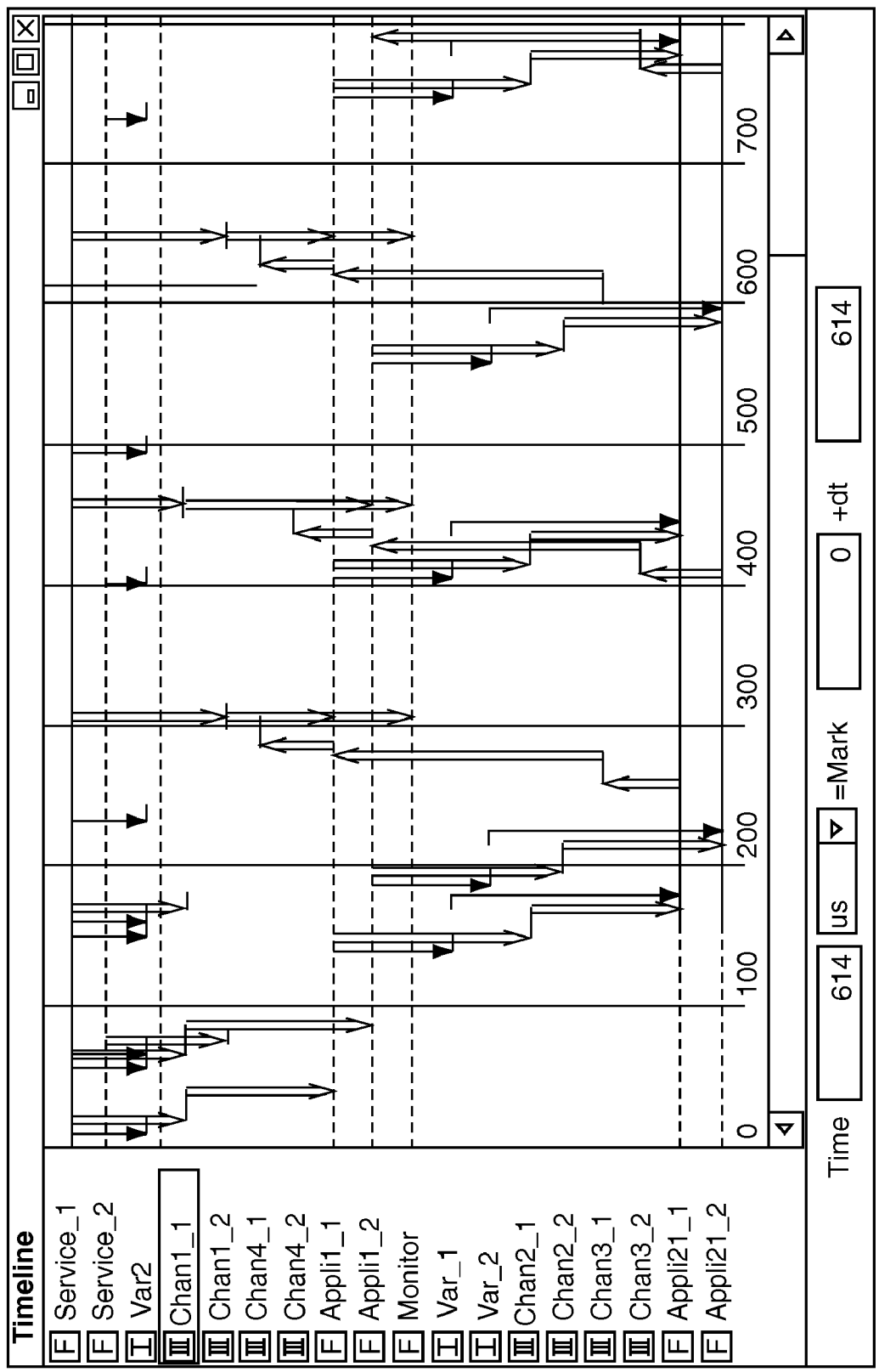
FIG. 8 shows an example of the time flow obtained by simulating the expanded model obtained by expansion of the multiple instance functional model in FIG. 5.

The result is viewed more particularly by simulation. FIG. 8 shows an example of a time flow obtained by simulating the expanded model, obtained by expansion of the multiple instance functional model in FIG. 5. This FIG. 8 shows that all the modelled functions and modelled relationships are individualised (there are no more vectors). The detailed analysis of the model behaviour is therefore much clearer.

Creating the Platform Model

The CoFluent Studio graphics editor is also used to capture the platform models constituted by modelled processors (CPU or DSP type software or ASIC or FPGA type hardware) and modelled shared memories communicating through modelled communication nodes.

Figure 9:
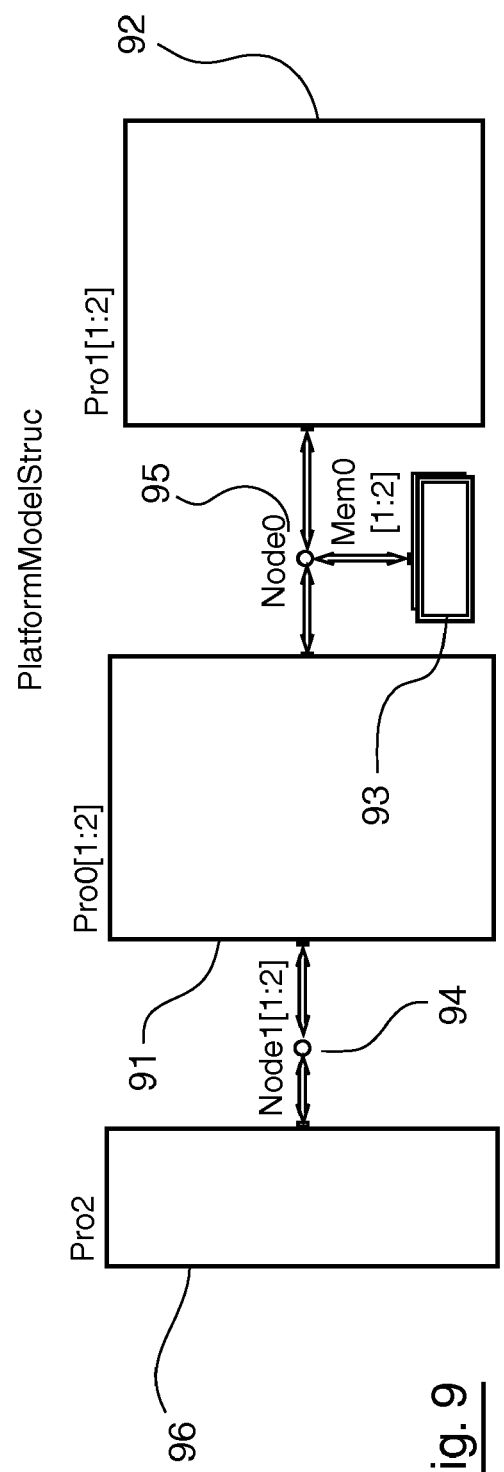
FIG. 9 shows an example of a multiple instance platform model, unexpanded.

FIG. 9 shows the illustrative example considered for the multiple instance platform model (unexpanded).

This platform model example includes processor vectors ("Pro0" and "Pro1", denoted 91 and 92 respectively, memory vectors ("Mem0", denoted 93) and communication node vectors ("Node1", denoted 94). It also includes a straightforward (non-vectored) modelled processor ("Pro2", denoted 96) and a straightforward (non-vectored) modelled communication node ("Node0", denoted 95.

Creating the Expanded Platform Model

The CoFluent Studio graphics editor has been enriched so as to produce systematically, when the graphics model is saved, a fully expanded textual model.

Figure 10:
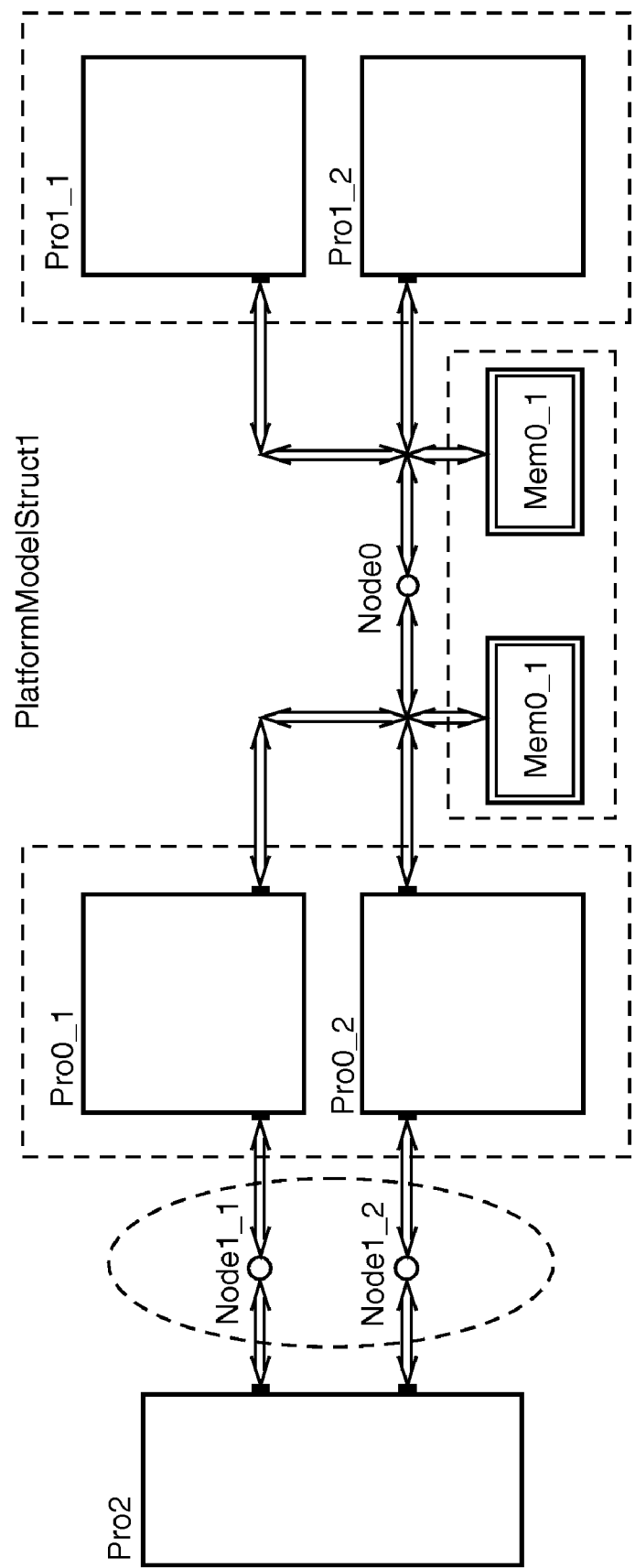
FIG. 10 shows an example of a expanded platform model, obtained by expansion of the multiple instance platform model in FIG. 9.

FIG. 10 shows an example of an expanded platform model, obtained by expansion of the multiple instance platform model in FIG. 9. This FIG. 10 has been shown manually with the tool since only a textual model is produced, which is sufficient for its subsequent exploitation.

This model cannot be simulated. It can however be used to produce architectural models, as described below.

Mapping the Expanded Application Model on the Expanded Platform Model

The CoFluent Studio architectural configuration tool enables the expanded models to be used to produce a resulting architectural model.

Figure 11:
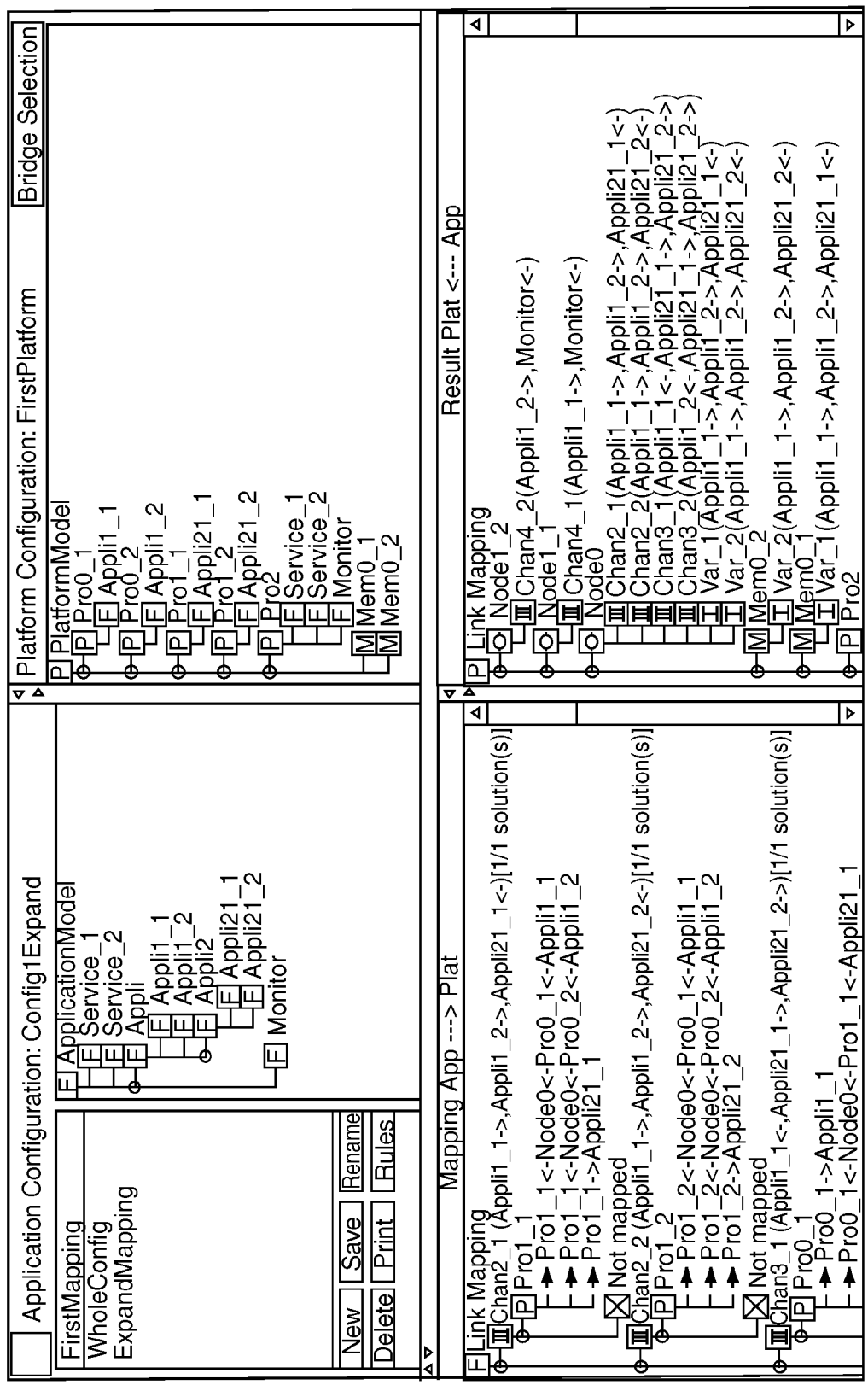
FIG. 11 shows a part of an example of an expanded architectural model, resulting from mapping the expanded functional model obtained by expansion of the multiple instance functional model in FIG. 5, on the expanded platform model in FIG. 10.

FIG. 11 shows a part of an example of an expanded architectural model, resulting from mapping the expanded functional model obtained by expanding the multi-instance functional model in FIG. 5, on the expanded platform model in FIG. 10.

The expanded application model is termed "Config1Expand" and the expanded platform model is termed "FirstPlatform". It can be seen in FIG. 11 that each modelled function is individualised and can be mapped on any modelled processor also individualised.

The upper left-hand part shows the decomposition tree of the expanded functional model corresponding to FIG. 5. Each individualised function is designated by its index (e.g.; Appli21-1, Appli21-2).

The upper right-hand part shows the decomposition tree of the expanded platform model corresponding to FIG. 9 and shown in FIG. 10.

The lower left-hand part gives a partial view of the mapping proposed by the tool for functional relationships that have to use a physical inter-processor link. In this can be seen the expanded Chan2_1 and Chan2-2 relationships. Proposals for solutions relate to the individualised processors Pro_1 and Pro_2.

The lower right-hand part is the mirror image of the left-hand part. It shows the functional relationship supported by each of the individualised physical relationships. For example Node1-2 supports the Chan4-2 relationship. Likewise, the individualised memories Mem0_1 and Mem0_2 implement variables Var_1 and Var_2 respectively.

The architectural SystemC model for verification and analysis thereof is produced by two generators:
  the generator of the architectural model as a fusion of the two models, application and platform, given the mapping specified above. This generator produces a textual model enabling it to be characterised by the attribute editor; and
  the SystemC source code generator, which converts the text model resulting from the previous generator into a SystemC program.

The result of these generators produces an executable model providing simulation traces.

Figure 12:
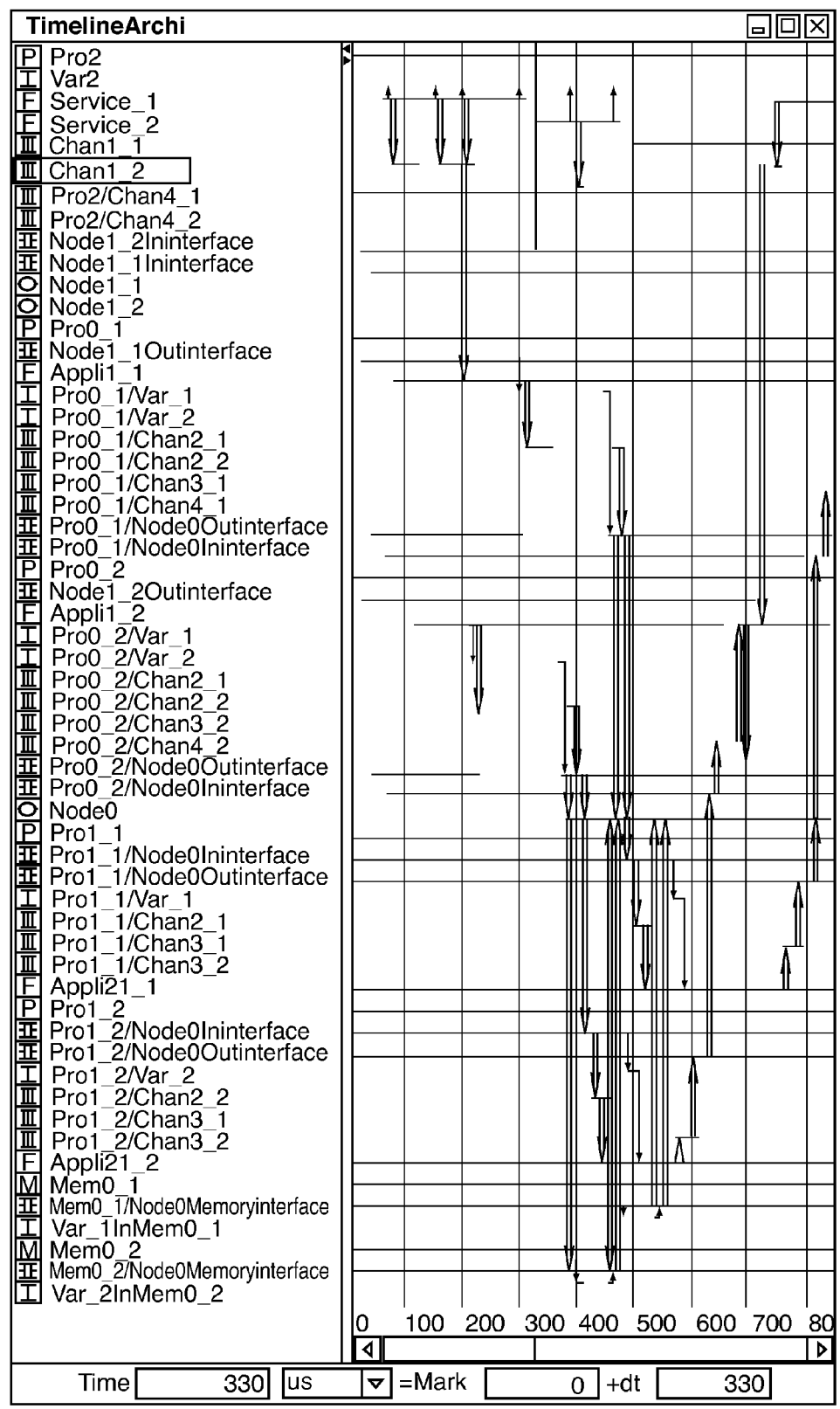
FIG. 12 shows an example of the time flow obtained by simulating the expanded architectural model shown partially in FIG. 11.

FIG. 12 shows an example of a time flow obtained by simulating the expanded architectural model partially shown in FIG. 11. It can be seen that all the modelled constituents are individualised, which allows fine parameterisation and an excellent interpretation of the detailed behaviour of the model.

Thus, as has already been indicated, the technique for describing the models on the basis of component and relationship vectors greatly simplifies the work of keyboarding the models and gives a better structure to their regularity and genericity. The model expansion technique greatly facilitates the detailed analysis of model behaviour and above all allows a better exploration of solutions architectures.

The present disclosure provides a technique for simulating a complex system with construction of at least one model of said system, said technique enabling the instance vector concept (in the aforementioned sense) to be used without however restricting the architecture possibilities (better exploration of solution architectures) and facilitating verification of the model or models constructed (in other words detailed analysis of model behaviour).

The disclosure provides a technique of this kind which is straightforward to implement and inexpensive.

Although the present disclosure has been described with reference to one or more examples, workers skilled in the art will recognize that changes may be made in form and detail without departing from the spirit and scope of the disclosure and/or the appended claims.

What is claimed is:

1. Method for the construction, within a computer system, of a functional model of a complex electronic system including a plurality of constituents, said functional model including a hierarchised set of modelled constituents, said method comprising:
  obtaining a multiple instance hierarchical functional model including at least one instance vector corresponding to a plurality of instances of one and the same modelled constituent, each instance vector being able to be located at any level of a hierarchical decomposition tree of said multiple instance hierarchical functional model;
  expanding said multiple instance hierarchical functional model into an expanded functional model, by expansion of at least one instance vector included in said multiple instance hierarchical functional model,
  wherein the step of expanding said multiple instance hierarchical functional model includes the following steps, carried out for each instance vector to be expanded corresponding to N instances of a modelled constituent:
    expanding said instance vector into a number of modelled constituents equal to said number N of instances; and
    producing the input or inputs and/or the output or outputs of each of the N modelled constituents, according to a set of at least one production rule,
  wherein said multiple instance hierarchical functional model includes at least one instance vector belonging to the group including:
    function vectors each corresponding to a plurality of instances of a modelled function; and
    relationship vectors each corresponding to a plurality of instances of a modelled relationship; and wherein said set of at least one production rule includes the following rules applied to the elementary function vectors each corresponding to a plurality of instances of a modelled elementary function:

if, in the multiple instance hierarchical functional model, an elementary function vector output is connected to a relationship vector:

if said elementary function vector output is associated with an output selector included in a behavioural model of said modelled elementary function:

if the output selector is defined by a parameter indicating assignment in a "1 to 1" relationship, then each instance obtained after expansion of the elementary function vector has an output connected, in said "1 to 1" relationship, to a same index instance among instances obtained after expansion of said relationship vector; and if the output selector is defined by a parameter indicating assignment in a "1 to X" relationship, with X>1, then each instance obtained after expansion of the elementary function vector has X outputs, each connected to a same index instance among the instances obtained after expansion of said relationship vector; and if said elementary function vector output is not associated with an output selector included in a behavioural model of said modelled elementary function, then each instance obtained after expansion of the elementary function vector has an output connected, in a "1 to 1" relationship, to a same index instance among the instances obtained after expansion of said relationship vector.

2. Method according to claim 1, wherein the step of expanding said multiple instance hierarchical functional model includes the following step, carried out for at least one instance vector which is an elementary function vector corresponding to a plurality of instances of a modelled elementary function: optimising the behavioural model of said modelled elementary function, by eliminating from said behavioural model at least one of:

any output selector associated with said modelled elementary function and indicating assignment in a "1 to 1" relationship; or any input selector associated with said modelled elementary function and indicating assignment in a "1 to 1" relationship.

3. Method according to claim 1 wherein said set of at least one production rule includes the following rule applied to the non-elementary function vectors each corresponding to a plurality of instances of a modelled non-elementary function:

if, in the multiple instance hierarchical model, an input, and output respectively, of a non-elementary function vector is connected to a relationship vector:

if there is a "1 to 1" relationship for all the inputs, and outputs respectively, connected to said relationship vector and belonging to functions which are internal to said modelled non-elementary function, each instance obtained after expansion of the non-elementary function vector has an input, and output respectively, connected in a "1 to 1" relationship, to a same index instance among the instances obtained after expansion of said relationship vector; and if not, each instance obtained after expansion of the non-elementary function vector has X inputs, and outputs respectively, each connected to a same index input, and output respectively, for all the instances obtained after expansion of said relationship vector.

4. Method according to claim 1, wherein the method further comprises:

constructing a hierarchical platform model of the complex system, which comprises obtaining a multi-instance hierarchical platform model and expanding said multi-instance hierarchical platform model into an expanded platform model; and allocating distributively said expanded functional model on said expanded platform model, allowing an expanded architectural model of said complex system to be obtained.

5. Method for the construction, within a computer system, of a functional model of a complex electronic system including a plurality of constituents, said functional model including a hierarchised set of modelled constituents, said method comprising:

obtaining a multiple instance hierarchical functional model including at least one instance vector corresponding to a plurality of instances of one and the same modelled constituent, each instance vector being able to be located at any level of a hierarchical decomposition tree of said multiple instance hierarchical functional model;

expanding said multiple instance hierarchical functional model into an expanded functional model, by expansion of at least one instance vector included in said multiple instance hierarchical functional model, wherein the step of expanding said multiple instance hierarchical functional model includes the following steps, carried out for each instance vector to be expanded corresponding to N instances of a modelled constituent:

expanding said instance vector into a number of modelled constituents equal to said number N of instances; and producing the input or inputs and/or the output or outputs of each of the N modelled constituents, according to a set of at least one production rule, wherein said multiple instance hierarchical functional model includes at least one instance vector belonging to the group including:

function vectors each corresponding to a plurality of instances of a modelled function; and relationship vectors each corresponding to a plurality of instances of a modelled relationship; and wherein said set of at least one production rule includes the following rules applied to the elementary function vectors each corresponding to a plurality of instances of a modelled elementary function:

if, in the multiple instance hierarchical functional model, an elementary function vector input is connected to a relationship vector:

if said elementary function vector input is associated with an input selector included in a behavioural model of said modelled elementary function:

if the input selector is defined by a parameter indicating assignment in a "1 to 1" relationship, then each instance obtained after expansion of the elementary function vector has an input connected, in said "1 to 1" relationship, to a same index instance among the instances obtained after expansion of said relationship vector;

if the input selector is defined by a parameter indicating assignment in a "1 to X" relationship, with X>1, then each instance obtained after expansion of the elementary function vector has X inputs, each connected to a same index instance among the instances obtained after expansion of said relationship vector;

if said elementary function vector input is not associated with an input selector included in a behavioural model of said modelled elementary function, then each instance obtained after expansion of the elementary function vector has X inputs, each connected to a same index instance among the instances obtained after expansion of said relationship vector.

6. Method according to claim 5, wherein the method further comprises:
constructing a hierarchical platform model of the complex system, which comprises obtaining a multi-instance hierarchical platform model and expanding said multi-instance hierarchical platform model into an expanded platform model; and
allocating distributively said expanded functional model on said expanded platform model, allowing an expanded architectural model of said complex system to be obtained.

7. Method for the construction, within a computer system, of a functional model of a complex electronic system including a plurality of constituents, said functional model including a hierarchised set of modelled constituents, said method comprising:
obtaining a multiple instance hierarchical functional model including at least one instance vector corresponding to a plurality of instances of one and the same modelled constituent, each instance vector being able to be located at any level of a hierarchical decomposition tree of said multiple instance hierarchical functional model;
expanding said multiple instance hierarchical functional model into an expanded functional model, by expansion of at least one instance vector included in said multiple instance hierarchical functional model,
wherein the step of expanding said multiple instance hierarchical functional model includes the following steps, carried out for each instance vector to be expanded corresponding to N instances of a modelled constituent:
expanding said instance vector into a number of modelled constituents equal to said number N of instances; and
producing the input or inputs and/or the output or outputs of each of the N modelled constituents, according to a set of at least one production rule,
wherein said multiple instance hierarchical functional model includes at least one instance vector belonging to the group including:
function vectors each corresponding to a plurality of instances of a modelled function; and
relationship vectors each corresponding to a plurality of instances of a modelled relationship; and
wherein said set of at least one production rule includes the following rules:
if, in the multiple instance hierarchical model, an elementary or non-elementary function vector output is connected to a modelled non-vectored relationship, then each instance obtained after expansion of the function vector has an output connected to said modelled relationship; and
if, in the multiple instance hierarchical model, an elementary or non-elementary function vector input is connected to a non-vectored modelled relationship, then each instance obtained after expansion of the function vector has an input connected to said modelled relationship.

8. Method according to claim 7, wherein the method further comprises:
constructing a hierarchical platform model of the complex system, which comprises obtaining a multi-instance hierarchical platform model and expanding said multi-instance hierarchical platform model into an expanded platform model; and
allocating distributively said expanded functional model on said expanded platform model, allowing an expanded architectural model of said complex system to be obtained.

9. Method for the construction, within a computer system, of a platform model of a complex electronic system including a plurality of constituents, said platform model including a hierarchised set of modelled constituents, said method comprising:
obtaining a multiple instance hierarchical platform model including at least one instance vector corresponding to a plurality of instances of one and the same modelled constituent, each instance vector being able to be located at any level of a hierarchical decomposition tree of said multiple instance hierarchical platform model;
expanding said multiple instance hierarchical platform model into an expanded platform model, by expansion of at least one instance vector included in said multiple instance hierarchical platform model,
wherein said multiple instance hierarchical platform model includes at least one instance vector belonging to the group including:
processor vectors each corresponding to a plurality of instances of a modelled processor;
memory vectors each corresponding to a plurality of instances of a modelled memory; and
communication node vectors each corresponding to a plurality of instances of a modelled communication node,
wherein the step of expanding said multiple instance hierarchical platform model includes the following steps, carried out for each instance vector to be expanded corresponding to N instances of a modelled constituent:
expanding said instance vector into a number of modelled constituents equal to said number N of instances; and
producing the input or inputs and/or the output or outputs of each of the N modelled constituents, according to a set of at least one production rule;
wherein with each communication node vector is associated an expansion configuration parameter, and
wherein said set of at least one production rule includes the following rules, for each communication node vector connected to a processor or memory vector:
if the expansion configuration parameter indicates "links to all", then each communication node vector instance is connected to each of the processor or memory vector instances;
if the expansion configuration parameter indicates "linear", then the instances of the processor or memory vector are connected to each other in a linear way, via instances of the communication node vector;
if the expansion configuration parameter indicates "ring", then the instances of the processor or memory vector are connected to each other in a ring, via instances of the communication node vector.

* * * * *